(12) United States Patent
Tanaka et al.

(10) Patent No.: US 7,758,209 B2
(45) Date of Patent: Jul. 20, 2010

(54) ILLUMINATION DEVICE AND LIQUID CRYSTAL DISPLAY DEVICE USING THE SAME

(75) Inventors: Toshiaki Tanaka, Kodaira (JP); Hiroki Kaneko, Hitachinaka (JP); Makoto Abe, Hitachi (JP); Akitoyo Konno, Hitachi (JP)

(73) Assignee: Hitachi Displays, Ltd., Mobara-shi (JP)

( * ) Notice: Subject to any disclaimer, the term of this patent is extended or adjusted under 35 U.S.C. 154(b) by 45 days.

(21) Appl. No.: 12/153,851

(22) Filed: May 27, 2008

(65) Prior Publication Data

US 2008/0298055 A1 Dec. 4, 2008

(30) Foreign Application Priority Data

May 31, 2007 (JP) ............................. 2007-144668

(51) Int. Cl.
*F21V 5/04* (2006.01)
(52) U.S. Cl. ...................... 362/231; 362/800; 362/235; 362/336
(58) Field of Classification Search ................. 362/800
See application file for complete search history.

(56) References Cited

U.S. PATENT DOCUMENTS 6,404,137 B1 * 6/2002 Shodo ..................... 315/169.1
6,483,439 B1 * 11/2002 Vukosic ................. 340/815.65
7,055,987 B2 * 6/2006 Staufert ..................... 362/235
7,224,000 B2 * 5/2007 Aanegola et al. .............. 257/98
7,427,145 B2 * 9/2008 Jang et al. ................... 362/236
7,441,929 B2 * 10/2008 Stefanov et al. ............. 362/336

FOREIGN PATENT DOCUMENTS

| JP | 2005-148095 | 6/2005 |
| JP | 2005-148440 | 6/2005 |

* cited by examiner

*Primary Examiner*—Anabel M Ton
(74) *Attorney, Agent, or Firm*—Antonelli, Terry, Stout & Kraus, LLP.

(57) ABSTRACT

The present invention provides an illumination device capable of improving an efficiency of acquiring light emitted by light emitting diodes, which are provided in a light source module and used as a light source, and capable of achieving a uniform luminance distribution, and provides a liquid crystal display device using the illumination device. The illumination device includes a circuit board, red, green and blue light emitting diodes, and a lens body. Each red, green and blue light emitting diode is mounted on the circuit board and connected with a wiring pattern formed on the circuit board. The lens covers the red, green and blue light emitting diodes, and includes first portions each having two first side surfaces and second portions each having two second side surfaces. The first and second portions are alternately arranged. A distance between the first side surfaces is larger than a distance between the second side surfaces. The three red, green and blue light emitting diodes are provided in each first portion of the lens.

11 Claims, 13 Drawing Sheets

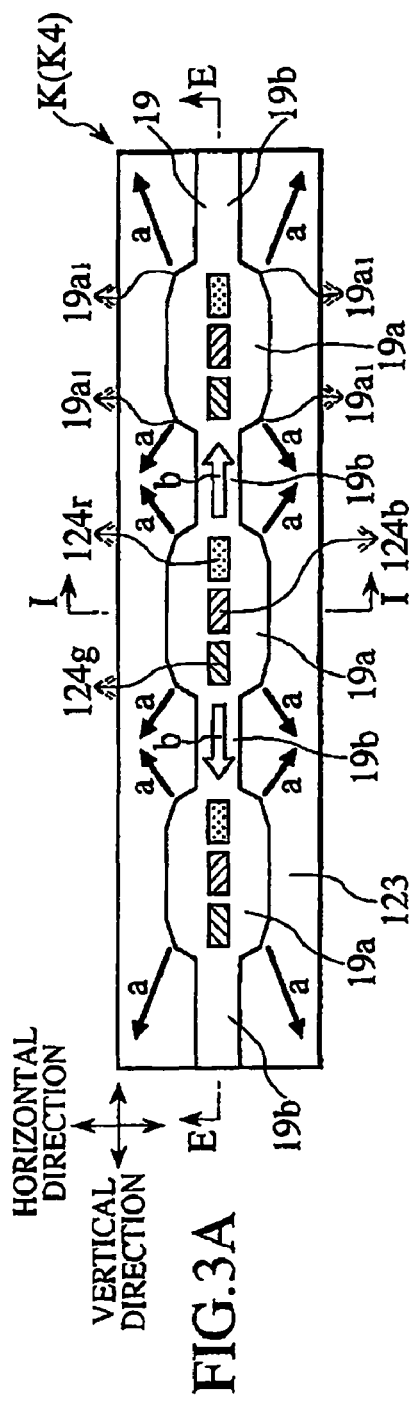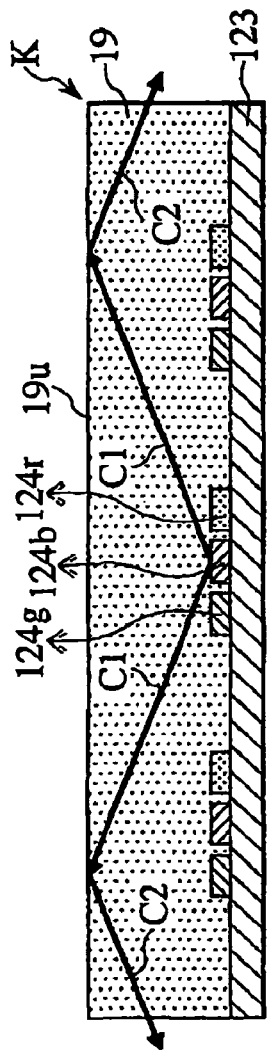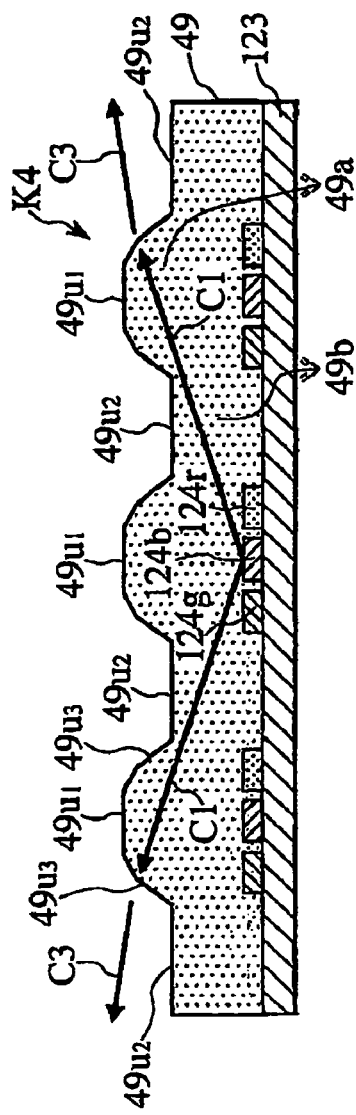

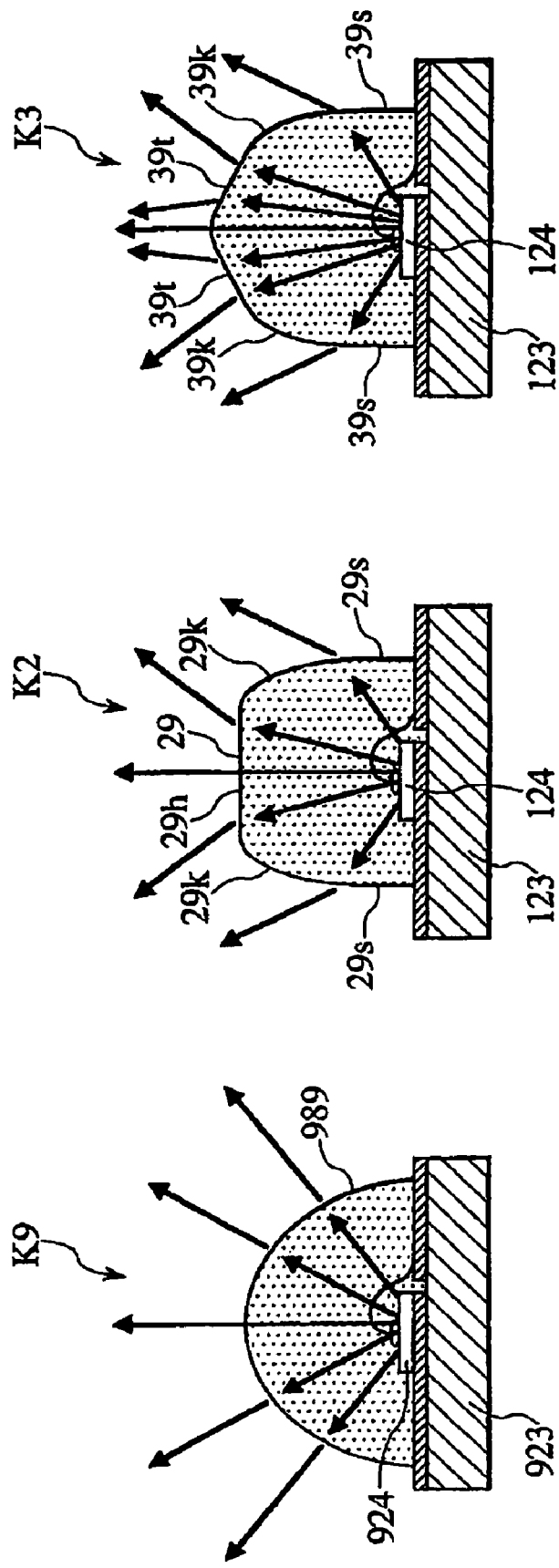

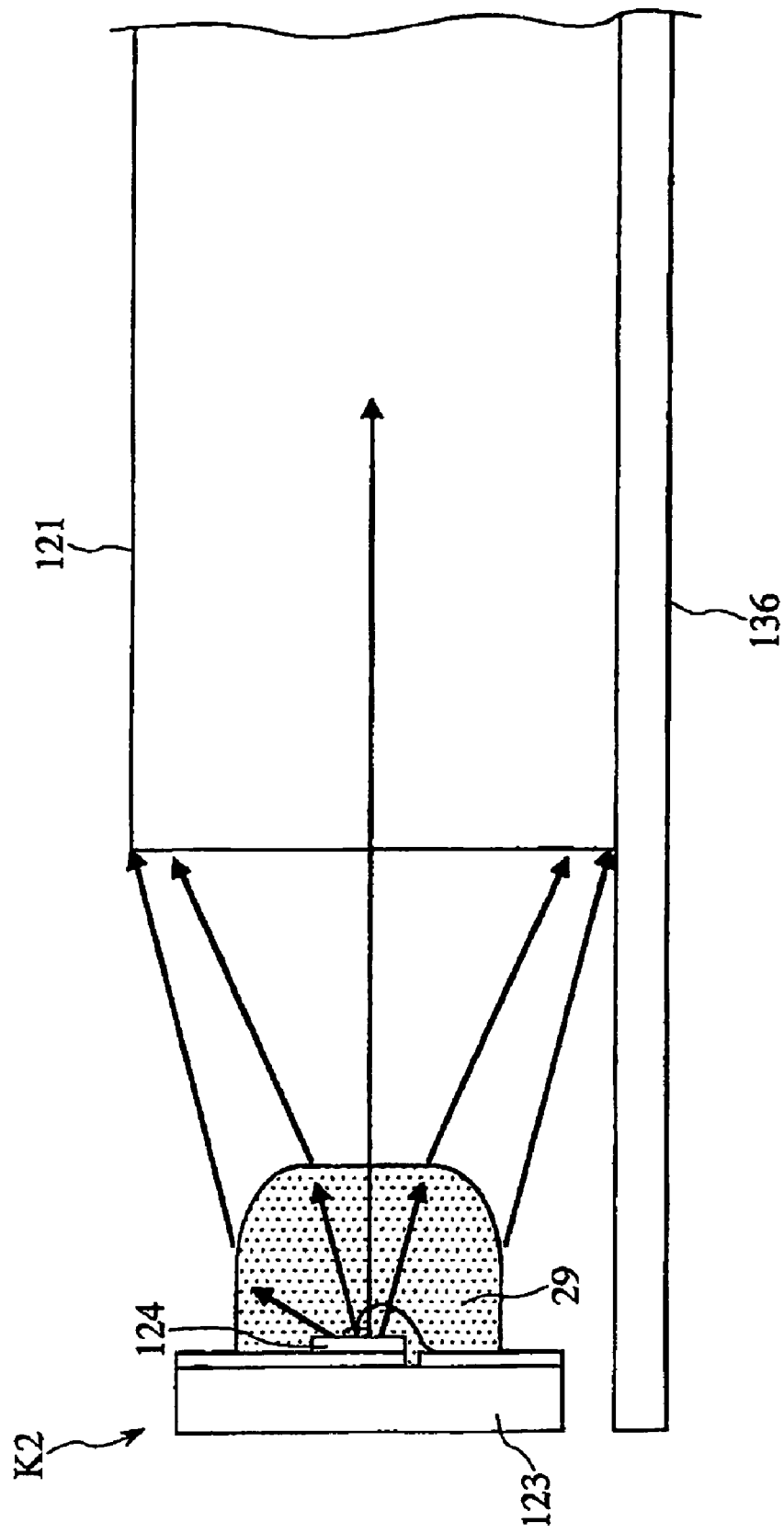

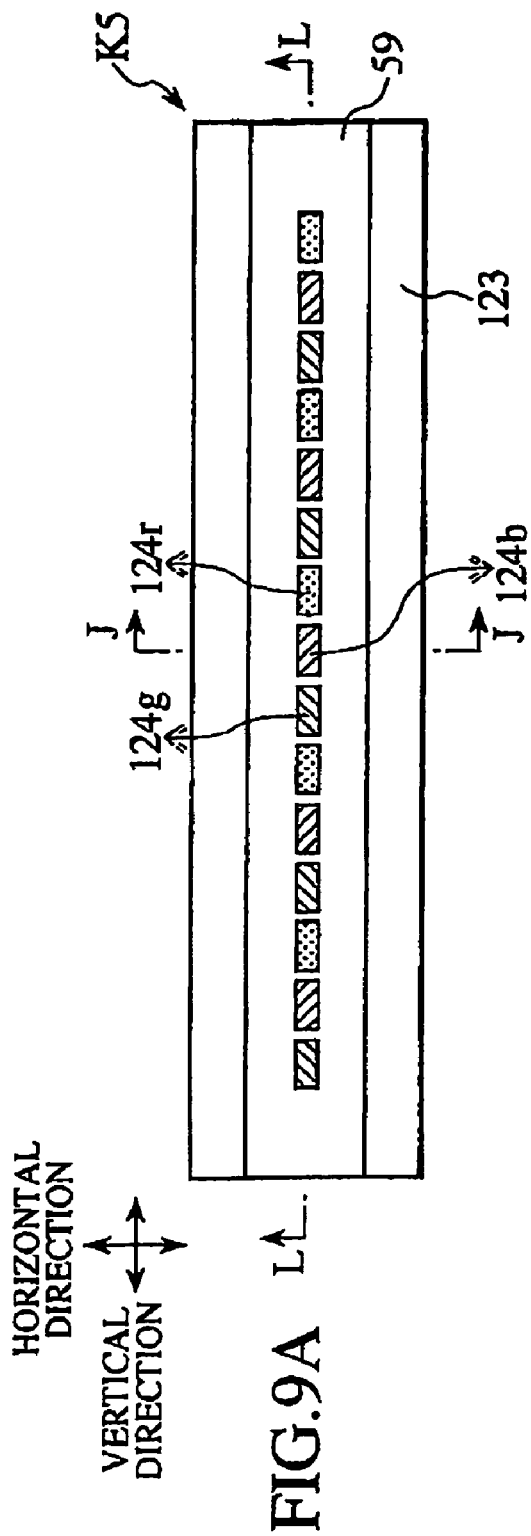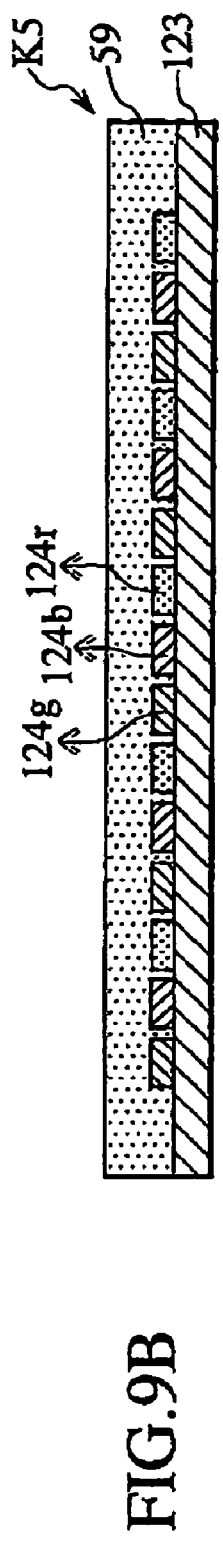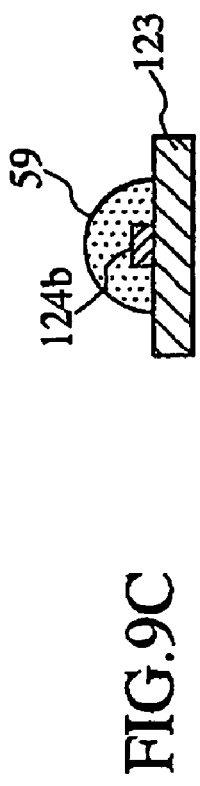

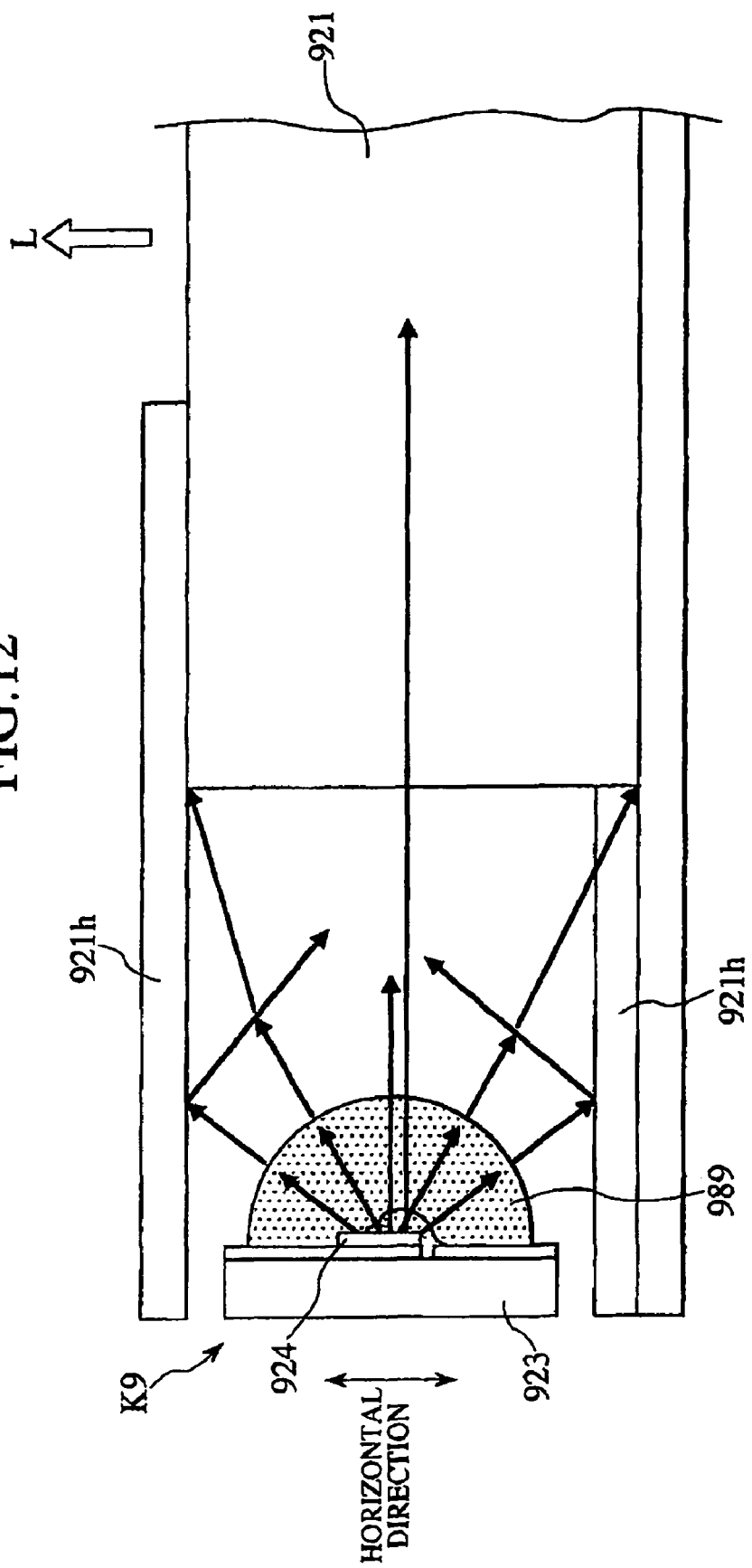

ILLUMINATION DEVICE AND LIQUID CRYSTAL DISPLAY DEVICE USING THE SAME

BACKGROUND OF THE INVENTION

1. Field of the Invention

The present invention relates to a light source using a light emitting diode, an illumination device using the light source as a backlight source, and a liquid crystal display device using the illumination device.

2. Description of the Related Art

Recently, light emitting diodes are applied not only to small and medium sized liquid crystal display devices but also to large sized liquid crystal display devices. The recent liquid crystal display device used for a television, personal computer and the like has a smaller dimension in a direction perpendicular to a display surface of a flat panel display than that of a conventional CRT-based television which emits an electron beam. In order to reduce the dimension, the recent liquid crystal display device uses side light sources, which are located on both sides of a display screen and emit light to a light guide plate. The light emitted by the side light sources is diffusely reflected and directed to a back portion of a liquid crystal section by the light guide plate as a surface light source. On the other hand, a conventional technique uses a light source, which is located on the back side of a screen and emits light to a back portion of a liquid crystal section, which is controlled by applying a voltage between electrodes.

In each of small and medium sized liquid crystal display devices, light emitting diodes are used as the side light source to achieve a thin and lightweight light source module. For large sized liquid crystal display devices, it is expected that a thin and lightweight light source module is achieved by using side light sources, similarly to the small and medium sized liquid crystal display devices.

In conventional techniques, the light source module uses cylindrical lenses as optical systems to focus light emitted by light emitting diodes on a light guide plate having side surfaces, each of which faces upper surfaces of the light emitting diodes. The light emitting diodes are sealed by transparent cylindrical resin to achieve various line light sources such as a light source for an illumination device and a backlight source module for a liquid crystal display device.

Each of JP-A-2005-148095 (refer to paragraphs 0034, 0051-0062, FIGS. 3 and 6) and JP-A-2005-148440 (refer to FIGS. 3 and 4) discloses a technique using cylindrical lenses as an optical system for a liquid crystal display. In JP-A-2005-148095, the optical system uses an optical sheet with the cylindrical lenses to reduce irregular brightness, moiré, and mechanical damage. In JP-A-2005-148440, a light blocking pattern defined by optical factors is provided at a non-light collecting portion of a lens section to ensure that light output from a non-light blocking part (opening) is directed by the lens section towards a liquid crystal panel. The construction of the optical system exhibits viewing angle characteristics providing a bright display image to a lot of viewers.

SUMMARY OF THE INVENTION

Each of the abovementioned Japanese patent publications describes that a cylindrical lens is used as an optical system for a liquid crystal display device to reduce irregular brightness and moiré, and a light blocking pattern is used to improve viewing angle characteristics. In each of the Japanese patent publications, however, a detail configuration of a light emitting diode is not described although the configuration of the optical system and the optical effect are described.

FIGS. 10A and 10B are diagrams each showing a light source module K9 having light emitting diodes 924, which are mounted on a light source mounting board 923 and sealed by transparent resin forming a cylindrical lens 989. FIG. 10A is a conceptual top view of an arrangement of the light emitting diodes 924 provided in the light source module K9. FIG. 10B is a cross sectional view of the light source module K9, which is taken along line A-A of FIG. 10A. FIG. 10C only shows the light emitting diode 924, and is an enlarged view of portion B shown in FIG. 10A to show the shape of the light emitting diode 924 provided in the light source module K9.

As shown in FIG. 10A, a plurality of the light emitting diodes 924 are mounted on the light source mounting board 923 provided in the light source module K9. As shown in FIG. 10B, a wiring pattern 923p is formed on the light source mounting board 923 and connected with the light emitting diode 924 through a wire w9. Each of the light emitting diodes 924 is mounted on the light source mounting board 923 and sealed by transparent resin forming the cylindrical lens 989. Light is emitted by each of the light emitting diodes 924 and focused by the cylindrical lens 989.

Each of the light emitting diodes 924 has a square upper surface shown in FIG. 10C. The upper surface of each of the light emitting diodes 924 faces the same direction as an upper surface of the light source mounting board 923, on which the light emitting diodes 924 are mounted. In addition, each of the light emitting diodes 924 has a positive electrode 924a and a negative electrode 924b on the upper surface thereof.

FIG. 11C is a graph showing intensities of light emitted by the light emitting diode 924 at an angle θ with respect to a normal c to a lower surface of the light emitting diode 924, where the normal extends through the center O of the lower surface of the light emitting diode 924, as shown in FIG. 11B. The lower surface of each of the light emitting diodes 924 faces the upper surface of the light source mounting board 923. In the graph shown in FIG. 11C, the angle is plotted on the abscissa axis, and the light intensity is plotted on the ordinate axis. In the graph, the angle of zero degrees corresponds to the light traveling in a direction along the normal c. The light intensity is expressed by an arbitrary unit such as Candela/m². As shown in FIG. 11A, a horizontal direction is defined as a direction parallel to a short side of the upper surface of the light source mounting board 923 provided in the light source module K9, while a vertical direction is defined as a direction parallel to a long side of the upper surface of the light source mounting board 923 provided in the light source module K9 (refer to FIG. 10A). A direction parallel to the short sides of the upper surface of the light source mounting board 923 is defined as a lateral direction of the light source mounting board 923. A direction parallel to the long sides of the upper surface of the light source mounting board 923 is defined as a longitudinal direction of the light source mounting board 923.

FIG. 11B shows the light emitting diode 924, which is viewed from the vertical direction shown in FIG. 11A. In FIG. 11B, the wiring pattern 923p is formed on the light source mounting, board 923 and connected with the light emitting diode 924 through the wire w9.

FIG. 11C shows that the intensities of the light emitted by the square light emitting diode 924 at angles of from −90 to +90 degrees in the horizontal direction with respect to the normal c are similar to the intensities of the light emitted by the square light emitting diode 924 at the same angles in the vertical direction. Thus, the square light emitting diode 924 is ideal for a point light source.

FIG. 12 is a diagram showing the arrangement including the light source module K9 and a light guide plate 921, and the final direction L of traveling of the light emitted by the light emitting diode 924 provided in the light source module K9.

As shown in FIG. 12, the upper surface of the light emitting diode 924 provided in the light source module K9 faces a side surface of the light guide plate 921, and reflective sheets 921h reflect some components of the light emitted by the light emitting diode 924. In this case, the light is emitted by the light emitting diode 924 and radiates in a space between the reflective sheets 921h, with the center O (refer to FIG. 11B) of the lower surface of the light emitting diode 924 as the origin of the radiation. Some components of the light reach the light guide plate 921h without being reflected by one or both of the reflective sheets 921h. Some components of the light are reflected by one or both of the reflective sheets 921h and then reach the light guide plate 921 since they are emitted at a large angle with respect to the normal to the lower surface of the light emitting diode 924 (the components of the light are indicated by arrows shown in FIG. 12).

The light emitted by the light emitting diode 924 is preferably incident on the light guide plate 921 without being reflected by one or both of the reflective sheets 921h since the loss of the quantity of the light is low. However, the light emitted by the light emitting diode 924 provided in the light source module K9 radiates with the center O (refer to FIG. 11B) of the lower surface of the light emitting diode 924 as the origin of the radiation. Thus, the quantity of components of the light, which are reflected by one or both of the reflective sheets 921 and reach the light guide plate 921, is large. Multiple reflections cause the loss of the light. Therefore, it is desirable that the light emitted by the light emitting diode 924 be directly incident on the light guide plate 921 without being reflected by one or both of the reflective sheets 921h.

FIG. 13B is a diagram showing the directions of traveling of the light emitted by the light emitting diode 924 at a certain angle with respect to the normal to the lower surface of the light emitting diode 924 within the cylindrical lens 989 in the vertical direction, i.e., the longitudinal direction of the light source mounting board 923, the angle being not zero. In FIG. 13B, the traveling directions of the light are indicated by arrows. In addition, FIG. 13B is a cross sectional view of the light source module K9, which is taken along line D-D of FIG. 13A. FIG. 13A is a top view of the light source module K9.

As shown in FIG. 13B, the cylindrical lens 989 has a cylindrical upper surface 989c. When a refraction angle of the light emitted by the light emitting diode 924 is not smaller than 90 degrees with respect to a normal to the cylindrical upper surface 989c, the light is fully reflected by the cylindrical upper surface 989c as shown in FIG. 13B. This causes the loss of the light emitted at certain angles with respect to the normal c in the longitudinal direction of the light source mounting board 923 provided in the light source module K9. Accordingly, the efficiency in coupling the light emitted by the light emitting diode 924 with the light guide plate 921 is not sufficiently high.

In the case of a large screen such as a screen of a large liquid crystal display television, a distance between the side surface of the light guide plate 921 and the cylindrical upper surface 989c of the cylindrical lens 989 provided in the light source module K9 is large. Thus, it is difficult that the light reaches the central part of the light guide plate 921. This results in difficulty in realizing uniformity of the light.

It is, therefore, an object of the present invention to provide an illumination device capable of improving an efficiency of acquiring light emitted by light emitting diodes, which are provided in a light source module and used as a light source, and capable of achieving a uniform luminance distribution, and to provide a liquid crystal display device using the illumination device.

To achieve the abovementioned object, an illumination device according to a first aspect of the present invention includes a circuit board, light emitting diodes, and a lens body. Each of the light emitting diodes is mounted on an upper surface of the circuit board and connected with a wiring pattern formed on the circuit board. The light emitting diodes are sealed by the lens body. The lens body includes first portions each having two first side surfaces and second portions each having two second side surfaces. The first and second portions are alternately arranged. A distance between the first side surfaces is larger than a distance between the second side surfaces, where the distances are measured in a horizontal direction parallel to a short side of the upper surface of the circuit board. In each of the first portions of the lens body, the three light emitting diodes for respectively emitting red light, green light and blue light are mounted.

An illumination device according to a second aspect of the present invention includes a circuit board, light emitting diodes, and a lens body. Each of the light emitting diodes is mounted on an upper surface of the circuit board and connected with a wiring pattern formed on the circuit board. Each of the light emitting diode is sealed by the lens body and has a rectangular upper surface facing the same direction as the upper surface of the circuit board. The light emitting diodes are arranged in a direction substantially parallel to a long side of each rectangular upper surface thereof. In addition, a group of the three light emitting diodes for respectively emitting red light, green light and blue light is repeatedly arranged. The lens body has a cylindrical shape extending substantially parallel to the long sides of the rectangular upper surface of each of the light emitting diodes.

A liquid crystal device according to a third aspect of the present invention has an illumination device. The illumination device includes a circuit board, light emitting diodes, and a lens body. Each of the light emitting diodes is mounted on an upper surface of the circuit board and connected with a wiring pattern formed on the circuit board. Each of the light emitting diodes is sealed by the lens body. The lens body includes first portions each having two first side surfaces and second portions each having two second side surfaces. The first and second portions are alternately arranged. A distance between the first side surfaces is larger than a distance between the second side surfaces, where the distances are measured in a horizontal direction parallel to a short side of the upper surface of the circuit board. In each of the first portions of the lens body, the three light emitting diodes for respectively emitting red light, green light and blue light are mounted.

The present invention provides an illumination device capable of improving an efficiency of acquiring light emitted by light emitting diodes, which are provided in a light source module, and capable of achieving a uniform luminance distribution, and to provide a liquid crystal display device using the illumination device.

BRIEF DESCRIPTION OF THE DRAWINGS

Other objects and advantages of the invention will become apparent from the following description of embodiments with reference to the accompanying drawings in which:

FIG. 3A is a top view of a light source module.

FIG. 3B is a cross sectional view of the light source module, which is taken along line E-E of FIG. 3A.

FIG. 3C is a cross sectional view of a light source module according to a fourth embodiment of the present invention, which is taken along line E-E of FIG. 3A.

FIG. 7A is a cross sectional view taken along line A-A of FIG. 10A and shows the light emitting diode having the square upper surface, which is viewed from the vertical direction and sealed by resin forming a conventional cylindrical lens shown in FIG. 10A, and emits light in directions indicated by arrows.

FIG. 7B is a cross sectional view taken along line I-I of FIG. 3A and shows the light emitting diode having the rectangular upper surface, which is viewed from the vertical direction, sealed by resin forming a lens according to a second embodiment of the present invention, and emits light in directions indicated by arrows.

FIG. 7C is a cross sectional view taken along line I-I of FIG. 3A and shows the light emitting diode having the rectangular upper surface, which is viewed from the vertical direction, sealed by resin forming a lens according to a third embodiment of the present invention, and emits light in directions indicated by arrows.

FIG. 8 is an enlarged view of the light source module including the lens according to the second embodiment and the light emitting diode which emits light indicated by arrows to the light guide plate.

FIG. 9A is a top view of a light source module according to a fifth embodiment of the present invention.

FIG. 9B is a cross sectional view of the light source module, which is taken along line L-L of FIG. 9A.

FIG. 9C is a cross sectional view of the light source module, which is taken along line J-J of FIG. 9A.

FIG. 12 is a diagram showing the arrangement including the conventional light source module and a light guide plate, and the final direction L of traveling of the light emitted by the conventional light emitting diode provided in the conventional light source module, in which the direction L is indicated by an arrow.

DETAILED DESCRIPTION OF THE PREFERRED EMBODIMENTS

An embodiment of the present invention will be described with reference to the accompanying drawings.

Figure 1A:
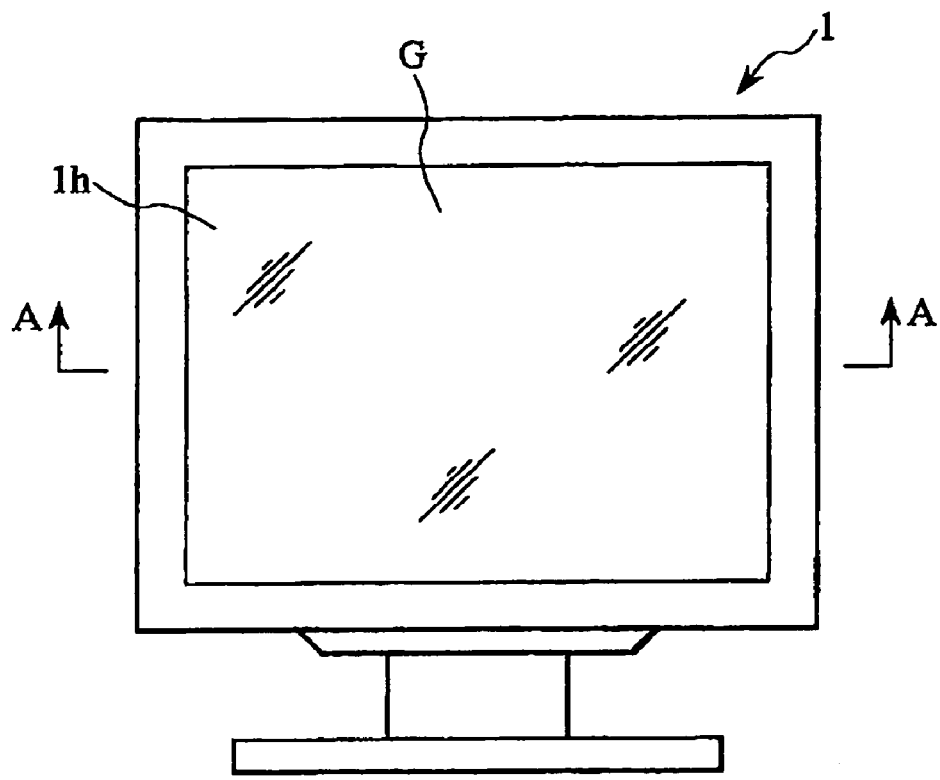
FIG. 1A is a front view of a liquid crystal display television according to an embodiment of the present invention.
Figure 1B:
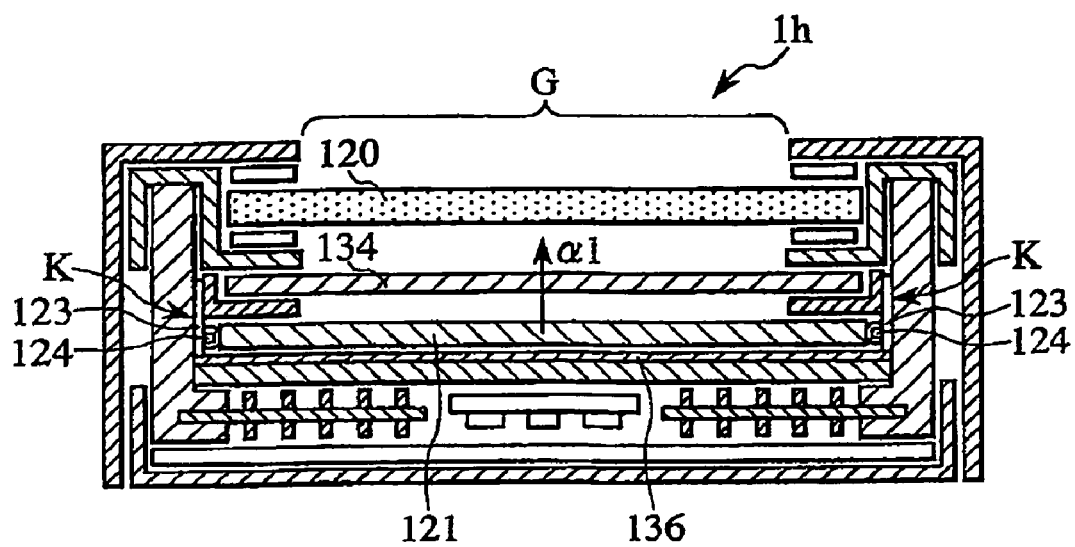
FIG. 1B is a conceptual cross sectional view of the liquid crystal display television, which is taken along line A-A of FIG. 1A.
Figure 2A:
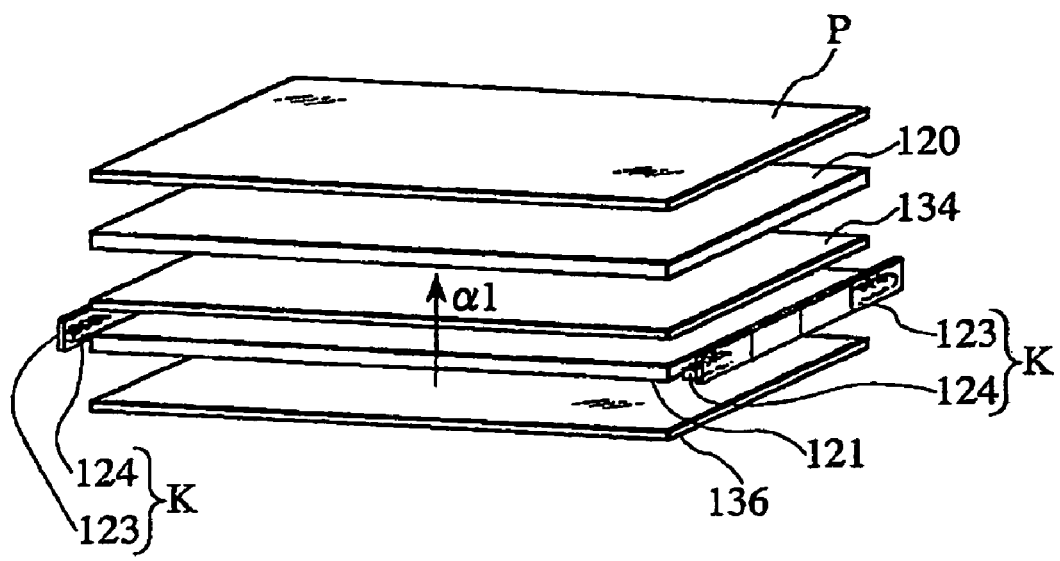
FIG. 2A is a perspective and exploded view of an image display unit 1h, which is viewed from an obliquely upward direction.

FIG. 1A is a front view of a liquid crystal display television (liquid crystal display device) 1. The liquid crystal display device 1 has an image display unit 1h as shown in FIG. 1A. The image display unit 1h displays an image by emitting light from a light source to a liquid crystal to which a voltage is applied, passing the light through the liquid crystal, irradiating the light on each pixel of a color filter, and displaying a color of each pixel. FIG. 1B is a conceptual cross sectional view of the liquid crystal display device 1, which is taken along line A-A of FIG. 1A. FIG. 2A is a perspective and exploded view of the image display unit 1h shown in FIG. 1B, which is viewed from an obliquely upward direction.

The image display unit 1h includes a liquid crystal panel 120, light source mounting boards 123, a light guide plate 121, a reflective sheet 136 and an optical sheet 134. The liquid crystal panel 120 is adapted to display an image by receiving light from the side of the optical sheet 134; passing the light through the liquid crystal, to which a voltage is applied, and the color filter; and generating a color at each pixel. The light source mounting boards 123 are provided on both sides of the light guide plate 121, the sides of the light guide plate 121 facing each other. Each of the light source mounting boards 123 has light emitting diodes 124 mounted thereon. The light emitting diodes 124 serve as a light source emitting light, which passes through the liquid crystal panel 120. The light guide plate 121 receives the light emitted by the light emitting diodes 124 located on both sides of the light guide plate 121, and diffuses the received light to cause the light to be directed to the liquid crystal panel 120 (cause the light to travel in a direction indicated by an arrow $\alpha1$ shown in FIGS. 1B and 2A). The reflective sheet 136 is provided on the back side of the light guide plate 121 (on the bottom side of FIG. 1B with respect to the light guide plate 121) and adapted to diffusely reflect light coming from the light guide plate 121 and cause the reflected light to be directed to the liquid crystal panel 120 (cause the reflected light to travel in the direction indicated by the arrow $\alpha1$). The optical sheet 134 adjusts the light (including the light reflected by the reflective sheet 136) coming from the light guide plate 121 to output uniform light. It should be noted that a transparent front panel P (refer to FIG. 2A) provided on the front side of the liquid crystal panel 120 is omitted in FIG. 1B.

Figure 2B:
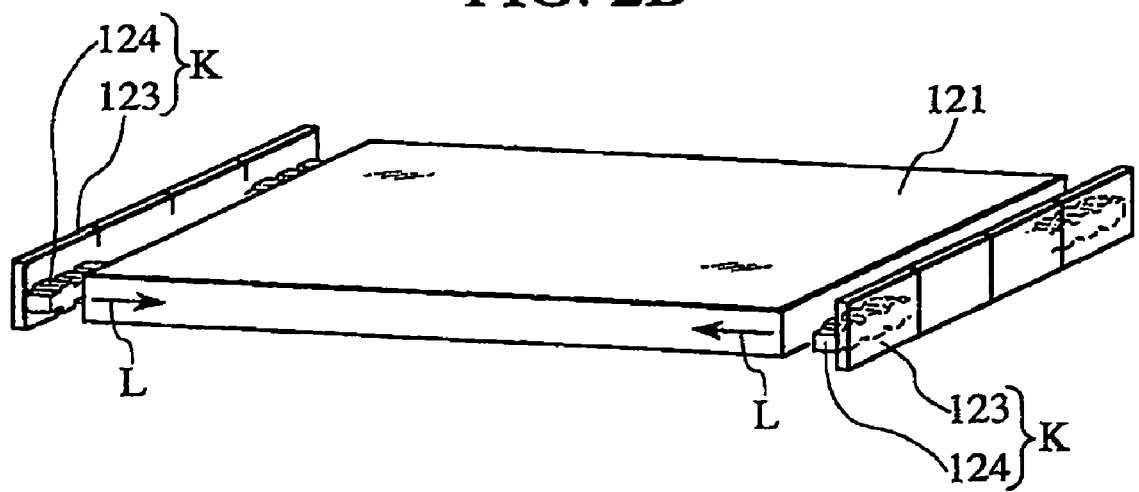
FIG. 2B is a perspective view of a light guide plate and a light source mounting board mounted with light emitting diodes, which are included in the image display unit 1h shown in FIG. 2A.

FIG. 2B is a perspective view of the light guide plate 121 and the light source mounting boards 123 each having a predetermined number of the light emitting diodes 124 (124r, 124g, 124b), which are shown in the perspective and exploded view of FIG. 2A. As shown in FIG. 2B, the number of the light source mounting boards 123 is four, each of which has a predetermined number of the light emitting diodes 124. The four light source mounting boards 123 are located symmetrically with respect to the center of the light guide plate 121. It should be noted that the light emitting diodes 124 provided on both sides of the light guide plate 121 and the light source mounting boards 123 are collectively called a light source module (which are also called an illumination device) K. The number of the light source modules K may be increased, which are to be provided on both sides of the light guide plate 121 shown in FIG. 1B.

First Embodiment

FIG. 3A is a top view of the light source module (the illumination device according to claim 1) K, which is viewed from the side of the light guide plate 121 shown in FIG. 2B. FIG. 3B is a cross sectional view of the light source module K, which is taken along line of E-E of FIG. 3A. The light emitting diodes 124 includes a red light emitting diode 124r, a green light emitting diode 124g and a blue light emitting diode 124b. As shown in FIG. 3A, the red light emitting diodes 124r, the green light emitting diodes 124g and the blue light emitting diodes 124b are mounted on the light source mounting board 123 constituting a part of the light source module K. The three kinds of the red, green and blue light emitting diodes 124r, 124g and 124b constitute a group. The number of the groups of the red, green and blue light emitting diodes may be selected. In FIGS. 3A to 3C, the three groups of the red, green and blue light emitting diodes are mounted on the light source mounting board 123. The red, green and blue light emitting diodes 124r, 124g and 124b are sealed by transparent resin forming a lens 19. The transparent resin is an acrylic or the like.

As shown in FIG. 3A, the lens 19 is provided on the light source mounting board 123 and includes first portions 19a each having two first side surfaces and second portions 19b each having two second side surfaces. The first and second portions of the lens 19 are alternately arranged. A distance between the first side surfaces of each of the first portions 19a is larger than a distance between the second side surfaces of each of the second portions 19b, where the distances are measured in a direction parallel to a short side of an upper surface of the light source mounting board 123, on which the light emitting diodes 124 are mounted. In other words, the lens 19 has a wobbling shape in which the distance between the side surfaces thereof varies depending on the portion of the lens 19. In each of the first portions 19a, the resin forming the lens 19 covers a group of the red, green and blue light emitting diodes 124r, 124g and 124b, which are mounted on the light source mounting board 123.

The wobbling shape allows the lens 19 to output light (indicated by black arrows a shown in FIG. 3A) emitted by the light emitting diodes 124 toward the light guide plate 121 at a large angle with respect to a normal to a lower surface of each of the light emitting diodes 124, without causing the light to be fully reflected by the reflective sheet 136. The lower surface of each of the light emitting diodes faces the upper surface of the light source mounting board 123.

Light indicated by white arrows b shown in FIG. 3A passes through the second portions 19b and is output from inclined sub portions 19a1 of each of the first portions 19a adjacent to the second portions 19b through which the light passes. The light then travels in the directions indicated by the black arrows a shown in FIG. 3A and is received by the light guide plate 121. This effect is achieved by light diffraction. The lens 19 having the wobbling shape is capable of improving a light focusing property.

In addition, the red, green and blue light emitting diodes 124r, 124g and 124b are arranged closely to the adjacent light emitting diode in each of the first portions 19a to ensure that color mixing can be performed in each of the first portions 19a. However, there is a large gap between the red light emitting diode 124r and the green light emitting diode 124g provided in the first portion 19a adjacent to the first portion 19a in which the abovementioned red light emitting diode 124r is provided. This arrangement reduces the degree of the color mixing between the abovementioned red and green light emitting diodes 124r and 124g. However, light emitted by the light emitting diodes within each of the first portions 19a is directed to and returned from the adjacent first portions 19a through the second portions 19b. This enhances the color mixing between the red and green light emitting diodes 124r and 124g. Similarly, the color mixing between the red and green light emitting diodes 124r and 124g within the same first portion 19a is enhanced since light emitted by the light emitting diodes within the same first portion 19a is directed to and returned from the adjacent or closely-located first portion 19a through the second portion 19b. Therefore, white light can be controlled by the color mixing.

The lens 19 may have a cross sectional shape having high lens portions and low lens portions, which are alternately arranged. Each of the high lens portions are continuous with each respective low lens portion. Each of high lens portions has a height larger than that of each of low lens portions, where each of the heights are measured in a direction parallel to the normal to the upper surface of the light source mounting board 123.

Referring to FIG. 3B, the lens 19 has an upper surface 19*u*. The lens 19 is composed of the transparent resin and formed on the light source mounting board 123 provided in the light source module K. The upper surface 19*u* of the lens 19 is substantially parallel to the upper surface of the light source mounting board 123 and is flat, or curved.

Figure 4A:
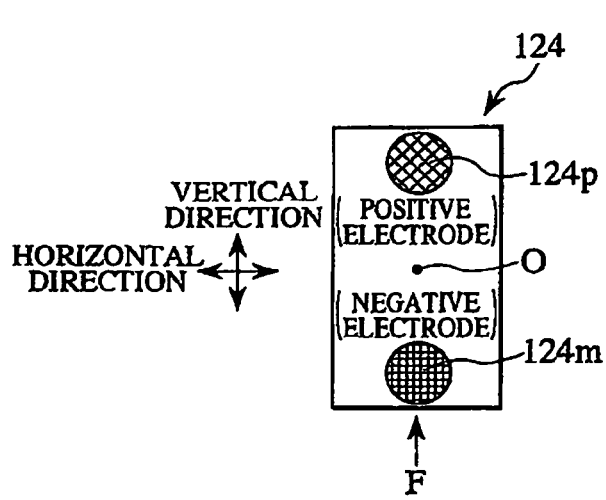
FIG. 4A is a diagram showing the light emitting diode having a rectangular upper surface.
Figure 4B:
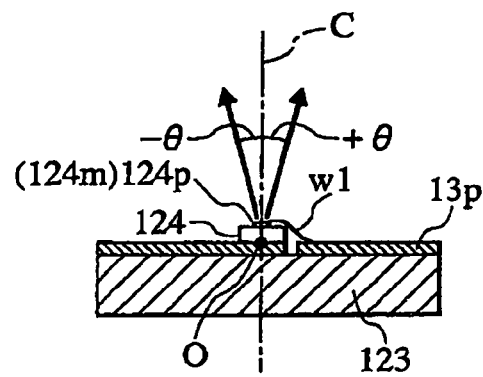
FIG. 4B is a diagram showing the light emitting diode shown in FIG. 4A, which is viewed from an F direction shown in FIG. 4A and is connected, through a wire, with a wiring pattern formed on the light source mounting board.

Each of the light emitting diodes 124 (124*r*, 124*g*, 124*b*) is mounted on the light source mounting board 123 and has a rectangular upper surface as shown in FIG. 4A. Positive and negative electrodes 124*p* and 124*m* of each of the light emitting diodes 124 are connected with a wiring pattern 13*p* formed on the light source mounting board 123 through a wire w1 as shown in FIG. 4B. FIG. 4B shows the light emitting diode 124, which is viewed from an F direction shown in FIG. 4A.

Figure 4C:
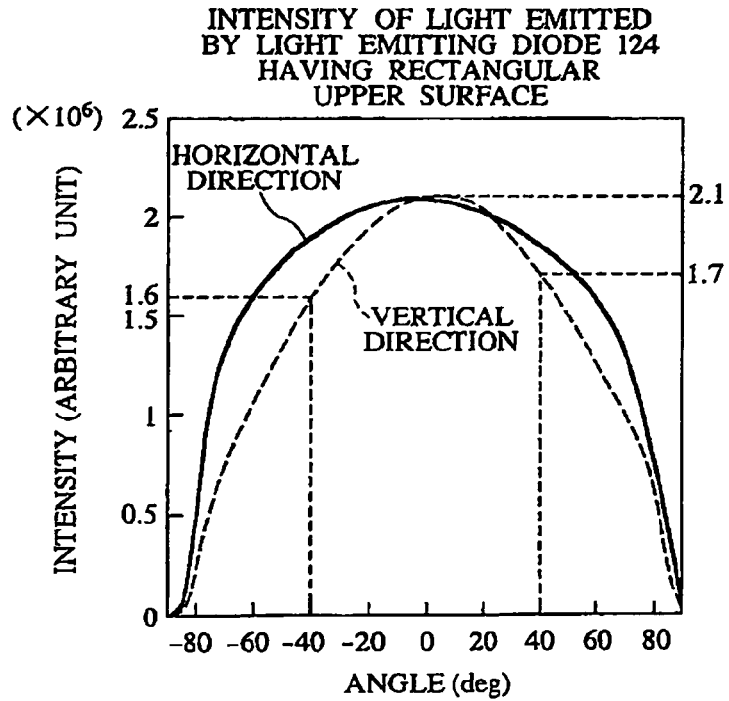
FIG. 4C is a graph showing intensities of light emitted by the light emitting diode at angles with respect to a normal to a lower surface of the light emitting diode in directions parallel to short and long sides of the rectangular upper surface of the light emitting diode, where the normal extends through the center O of the lower surface of the light emitting diode and corresponding to the angle of zero degrees.

FIG. 4C is a graph showing intensities of light emitted by the light emitting diode 124 at an angle θ with respect to a normal c to the lower surface of the light emitting diode 124, where the normal extends through the center of the lower surface of the light emitting diode 124 and corresponds to the angle of zero degrees. In the graph shown in FIG. 4C, the angle is plotted on the abscissa axis, and the light intensity is plotted on the ordinate axis. In the graph, the angle of zero degrees means that the emitted light travels in a direction along the normal c. The light intensity is expressed by an arbitrary unit such as Candela/m$^2$. As shown in FIG. 4A, horizontal and vertical directions are defined. That is, the horizontal direction is parallel to a short side of the rectangular upper surface of the light emitting diode 124, i.e., a short side of the light source mounting board 123 provided in the light source module K. The vertical direction is parallel to a long side of the rectangular upper surface of the light emitting diode 124, i.e., a long side of the upper surface of the light source mounting board 123, provided in the light source module K (refer to FIG. 3A). A direction parallel to the short sides of the upper surface of the light source mounting board 123 is defined as a lateral direction of the light source mounting board 123. A direction parallel to the long sides of the upper surface of the light source mounting board 123 is defined as a longitudinal direction of the light source mounting board 123.

As shown in FIG. 4C, the light having high intensities is emitted by the light emitting diode 124 at small angles with respect to the normal c in the vertical direction, i.e., the longitudinal direction of the light source mounting board 123 provided in the light source module K.

Here, the intensities (shown in FIG. 4C) of the light emitted by the light emitting diode 124 having the rectangular upper surface in the vertical direction are compared with the intensities (shown in FIG. 11C) of the light emitted by the light emitting diode 924 having the square upper surface in the vertical direction. The intensities of the light emitted by the light emitting diode 124 are higher than those of the light emitted by the light emitting diode 924 with respect to an angle range including the angles of ±40 degrees in the vertical direction. In addition, light output capability of the light guide plate 121 is considered to be significantly affected by the light emitted at the angles of ±40 degrees. Thus, the light emitting diode 124 having the rectangular upper surface is more desirable than the light emitting diode 924 having the square upper surface for the light emitted at angles with respect to the normal c in the vertical direction, i.e., the longitudinal direction (refer to FIG. 3A) of the light source mounting board 123 provided in the light source module K.

The light emitting diode 924 shown in FIG. 12 is replaced with the light emitting diode 124 (refer to FIG. 4A), which emits light traveling at certain angles with respect to the normal to the lower surface of the light emitting diode 124 in the horizontal direction. When the light is emitted by the light emitting diode 124 in the direction of the normal to the lower surface of the light emitting diode 124 or at a small angle with respect to the normal in the horizontal direction, the light directly travels toward the light guide plate 921 without being reflected by the reflective sheet 921*h*, which results in a high light efficiency. However, when the light is emitted by the light emitting diode 124 at a large angle with respect to the normal to the lower surface of the light emitting diode 124 in the horizontal direction, the light is reflected by the reflective sheet 921*h* and then directed to the light guide plate 921, which results in a loss of the light and a low light efficiency.

Figure 5A:
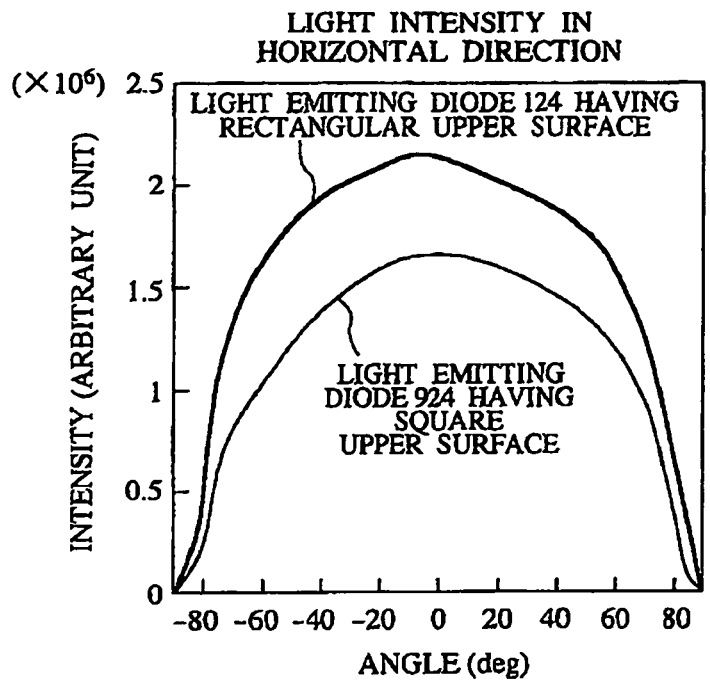
FIG. 5A is a graph showing intensities of light emitted by the light emitting diode having the rectangular upper surface and by a light emitting diode having a square upper surface in the lateral direction.
Figure 11A:
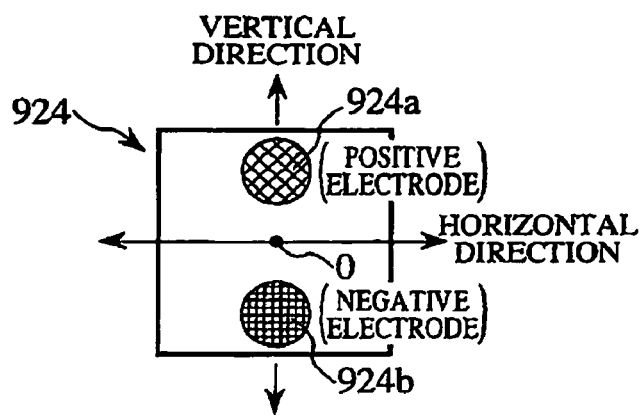
FIG. 11A is a top view of a conventional light emitting diode having a square upper surface.
Figure 11B:
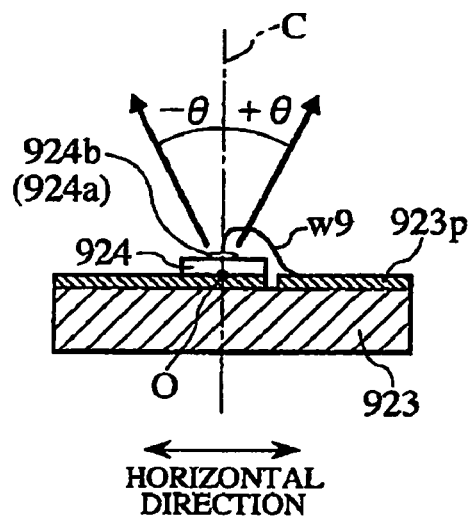
FIG. 11B is a cross sectional view of the conventional light emitting diode shown in FIG. 11A, which is connected with a wiring pattern formed on a light source mounting board through a wire, and is viewed from the horizontal direction shown in FIG. 11A.
Figure 11C:
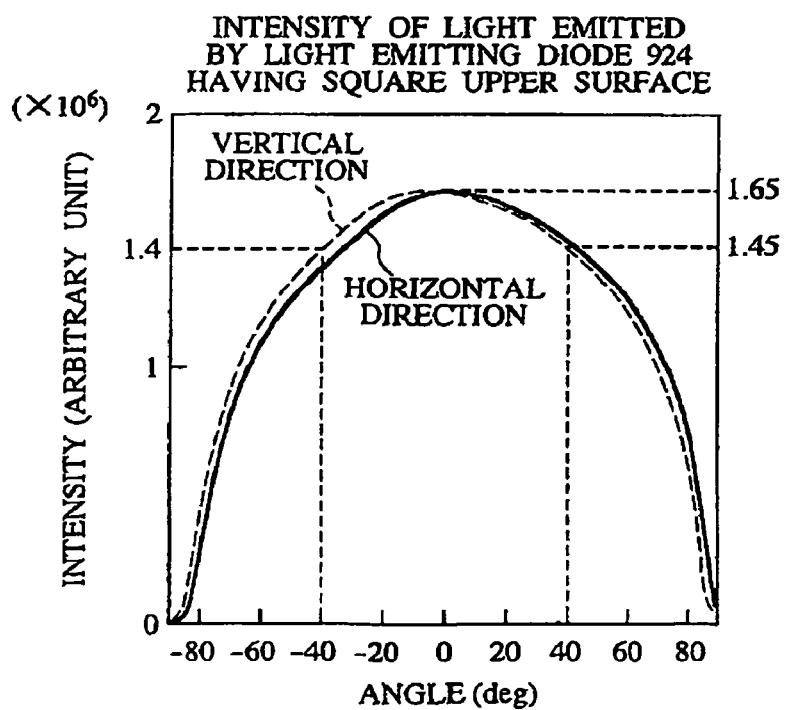
FIG. 11C is a graph showing intensities of light emitted by the conventional light emitting diode at angles with respect to a normal to a lower surface of the conventional light emitting diode in the vertical and horizontal directions shown in FIG. 11A, where the normal extends through the center O of the lower surface of the conventional light emitting diode and corresponding to the angle of zero degrees.
Figure 13A:
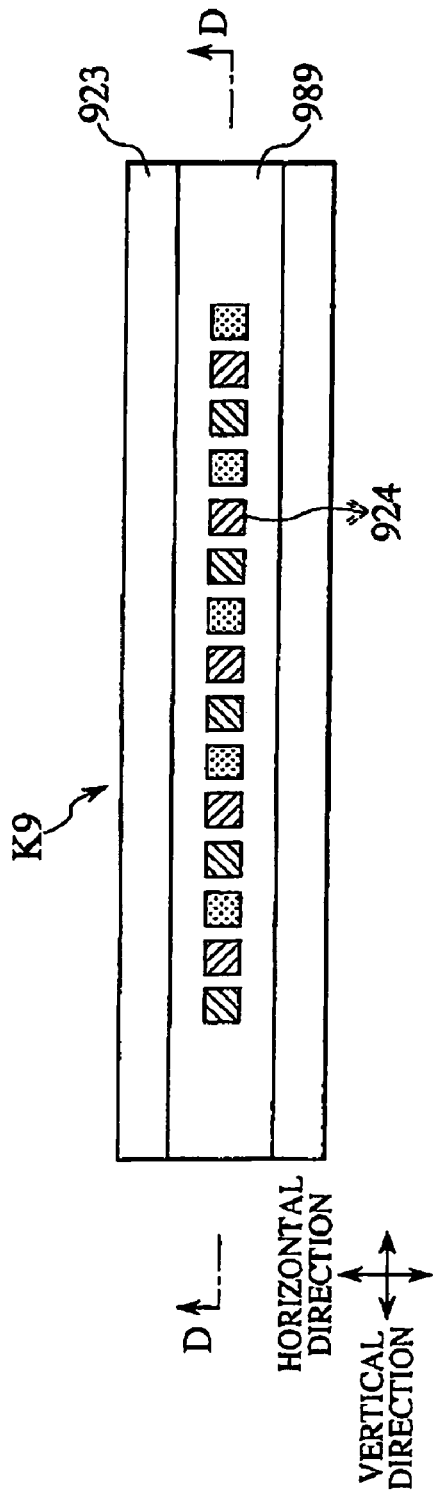
FIG. 13A is a top view of the conventional light source module.
Figure 13B:
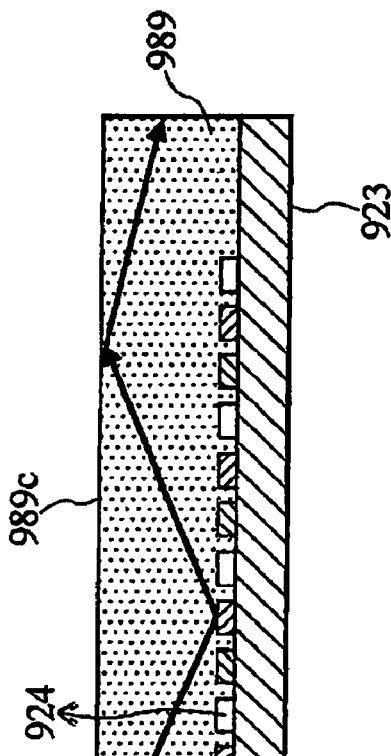
FIG. 13B is a cross sectional view of the conventional light source module, which is taken along line D-D of FIG. 13A.

FIG. 5A is a graph showing the intensities of the light emitted by the light emitting diode 124 having the rectangular upper surface in the horizontal direction shown in FIG. 4A and the intensities (refer to FIG. 11C) of the light emitted by the light emitting diode 924 having the square upper surface in the horizontal direction shown in FIG. 11A. The angle of the direction of traveling of the light with respect to the normal c to the lower surface of the light emitting diode 124 is plotted on the abscissa axis, while the light intensity is plotted on the ordinate axis. A graph shown in FIG. 5B will be described later.

As shown in FIG. 5A, the intensities of the light emitted by the light emitting diode 124 is higher than those of the light emitted by the light emitting diode 924 with respect to almost the entire angle range of the angles plotted on the abscissa axis. The ratio of the integrated intensity of the light emitted by the light emitting diode 124 relative to the integrated intensity of the light emitted by the light emitting diode 924 is 1.34:1. Thus, the light emitting diode 124 is more desirable than the light emitting diode 924 for the light emitted at angles with respect to the normal to the lower surface of the light emitting diode in the horizontal direction, i.e., the lateral direction (refer to FIG. 3A) of the light source mounting board 123 provided in the light source module K.

Based on the abovementioned results, the light emitting diode 124 having the rectangular upper surface is advantageous over the light emitting diode 924 having the square upper surface for the light emitted at angles with respect to the normal to the lower surface of the light emitting diode in the vertical direction, i.e., the longitudinal direction (refer to FIG. 3A) of the light source mounting board 123 provided in the light source module K and in the horizontal direction, i.e., the lateral direction (refer to FIG. 3A) of the light source mounting board 123 provided in the light source module K. The light emitting diode 124 having the rectangular upper surface is therefore used. It should be noted that the rectangular upper surface of the light emitting diode 124 and the square upper surface of the light emitting diode 924 have the same area, as shown in FIGS. 4A and 11A.

The light emitting diode 124 having the rectangular upper surface is capable of providing sufficient luminance due to the length thereof, where the length is measured in the abovementioned vertical direction. The light emitting diode 124 has long sides and short sides as shown in FIG. 4A. The long sides are substantially parallel to the vertical direction while the short sides are substantially parallel to the horizontal direction. When the long sides of the rectangular upper surface of the light emitting diode 124 are larger by three times than the short sides of the rectangular upper surface of the light emitting diode 124, some components of the light emitted by the light emitting diode 124 are absorbed by the reflective sheet 136. As a result, the light intensity is reduced. The optimal ratio of the long sides of the rectangular upper surface of the light emitting diode 124 relative to the short sides thereof is 2:1 to 3:1 to ensure that the light guide plate 121 receives the light having a high intensity.

Figure 6A:
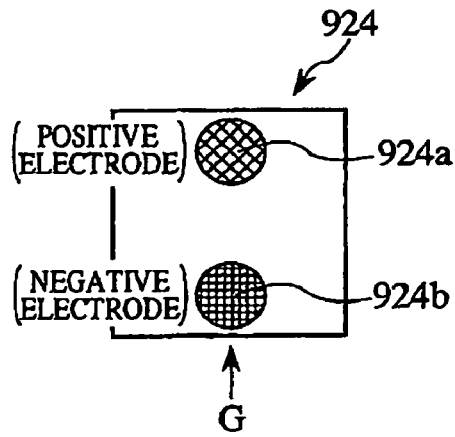
FIG. 6A is a top view of the light emitting diode having the square upper surface.
Figure 6C:
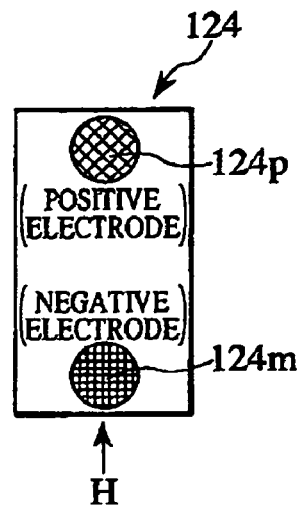
FIG. 6C is a top view of the light emitting diode having the rectangular upper surface.
Figure 6B:
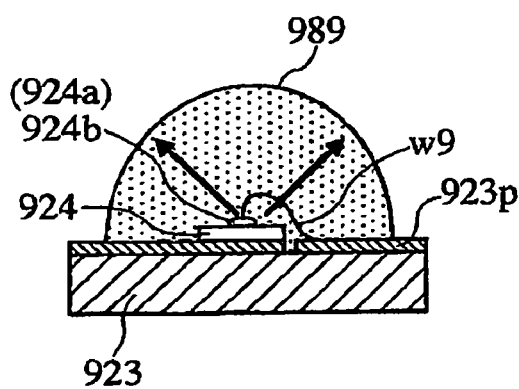
FIG. 6B is a diagram showing the light emitting diode, which is viewed from a G direction shown in FIG. 6A and is sealed by resin forming a conventional cylindrical lens.
Figure 6D:
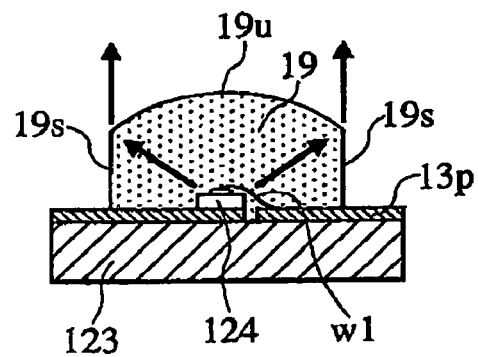
FIG. 6D is a diagram showing the light emitting diode, which is viewed from an H direction shown in FIG. 6C and is sealed by transparent resin.
Figure 6E:
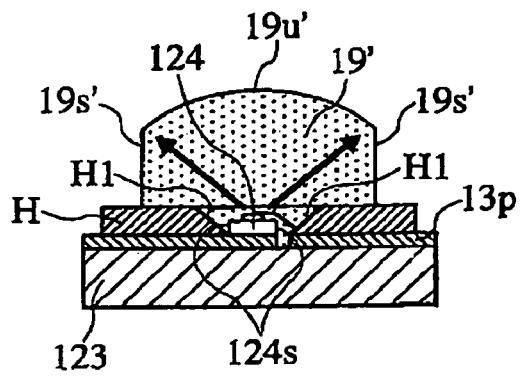
FIG. 6E is a diagram showing a modification in which the light emitting diode viewed from the H direction is sealed by transparent resin.

FIG. 6A is a top view of the conventional light emitting diode 924 having the square upper surface. FIG. 6B is a diagram showing the conventional light emitting diode 924, which is viewed from a G direction shown in FIG. 6A and sealed by the resin forming the conventional cylindrical lens 989. FIG. 6C is a top view of the light emitting diode 124 to be used in the present embodiment. FIG. 6D is a diagram (cross sectional view taken along line I-I of FIG. 3A) showing the light emitting diode 124, which is viewed from an H direction shown in FIG. 6C and sealed by the transparent resin forming the lens 19. FIG. 6E is a diagram showing a modification in which the light emitting diode 124 viewed from the H direction is sealed by transparent resin forming a lens 19'.

The conventional light emitting diode 924 (shown in FIG. 6A) is sealed by the resin forming the cylindrical lens 989 shown in FIG. 6B. The light emitting diode 924 is ideal for a point light source for emitting light at angles of −90 to +90 degrees with respect to the normal to the lower surface of the light emitting diode 924 in the horizontal direction, i.e., the lateral direction of the light source mounting board 923. Although the light emitted by the light emitting diode 924 is irradiated on a small side surface of the light guide plate 121, the light spreads into an excessively large area in the horizontal direction, resulting in a low light efficiency.

In the present embodiment, the light emitting diode 124 shown in FIG. 6C has the rectangular upper surface and is mounted on the light source mounting board 123. The light emitting diodes 124 is sealed by the lens 19. Each of the first portions 19a of the lens 19 has the abovementioned two first side surfaces 19s (described in claim 5) perpendicular to the upper surface of the light source mounting board 123. In addition, the upper surface 19u (described in claim 5) of the lens 19 is continuous with the first side surfaces 19s thereof. Furthermore, the upper surface 19u is cylindrical and has a curvature radius larger than a distance between the center of the lower surface of the light emitting diode 124 and a top portion of the lens 19, or is a non-cylindrical surface having a curvature radius, which varies depending on the portion thereof. The top portion of the lens body is the most distant portion of the lens body from the upper surface of the circuit board. The configuration shown in FIG. 6D allows a large amount of the light emitted by the light emitting diode 124 to be focused on the light guide plate 121 having the small side surface in the space defined by arrows. The small side surface of the light guide plate 121 faces the rectangular upper surface of each of the light emitting diodes 124.

FIG. 6E is a diagram showing a modification of the configuration shown in FIG. 6D, and a cross sectional view taken along line I-I of FIG. 3A. In the configuration shown in FIG. 6E, a reflective material H (described in claim 6) has reflective surfaces H1 (described in claim 6) and is formed on the light source mounting board 123 to ensure that the light emitted by the light emitting diode 124 is efficiently focused by a transparent lens 19' on the light guide plate 121. The reflective surfaces H1 are located on both sides of each of the light emitting diodes 124. In addition, each of the reflective surfaces H1 is inclined with respect to a normal to the upper surface of the light source mounting board 123. Specifically, as a portion of each of the reflective surfaces H1 is distant from each respective light emitting diode 124, the portion is distant from the upper surface of the light source mounting board 123. The reflective material H is formed of a ceramic, resin, or the like. As shown in FIG. 6E, the transparent lens 19' is formed on the reflective material H. The transparent lens 19' has side surfaces 19s' perpendicular to the upper surface of the light source mounting board 123. In addition, the transparent lens 19' has a cylindrical upper surface having a curvature radius larger than a distance between the center of the lower surface of the light emitting diode 124 and a top portion of the transparent lens 19', or is a non-cylindrical surface having a curvature radius, which varies depending on the portion thereof. The top portion of the transparent lens 19' is the most distant portion of the transparent lens 19' from the upper surface of the light source mounting board 123. The transparent lens 19' covers the light emitting diodes 124.

In the configuration of the modification shown in FIG. 6E, light emitted by the light emitting diode 124 and output from side surfaces 124s of the light emitting diode 124 is reflected by the reflective surfaces H1, passes through the transparent lens 19', and is focused by the transparent lens 19' on the light guide plate 121. The efficiency of acquiring the light in the configuration shown in FIG. 6E is higher the efficiency of acquiring the light in the configuration shown in FIG. 6D.

The light source mounting board 123 is formed of a metal substrate, ceramic substrate, a printed circuit board, or the like. The ceramic substrate is advantageous over the others for reflectance. The metal substrate and the ceramic substrate are advantageous over the others for radiation performance.

Second Embodiment

Next, a description will be made of second and third embodiments of the present invention, which aim at increasing the intensities (refer to FIGS. 3A and 4A) of the light emitted by the light emitting diode 124 having the rectangular upper surface.

FIGS. 7A to 7C are diagram to compare directions of traveling of the light output from light source modules in the second and third embodiments with those of traveling of the light output from the conventional light source module. In FIGS. 7A to 7C, the directions of traveling of the light are indicated by arrows.

Figure 10A:
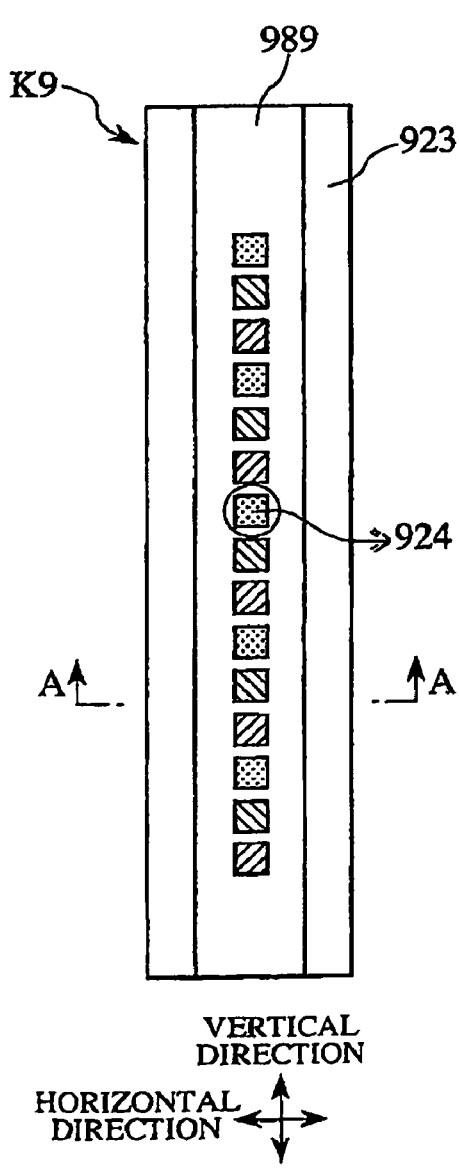
FIG. 10A is a conceptual top view of the arrangement of light emitting diodes provided in a conventional light source module.
Figure 10B:
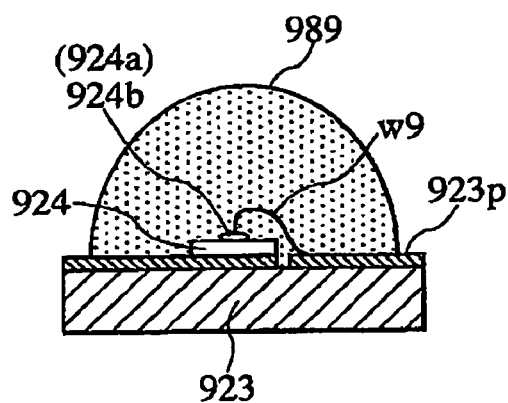
FIG. 10B is a cross sectional view of the conventional light source module, which is taken along line A-A of FIG. 10A.
Figure 10C:
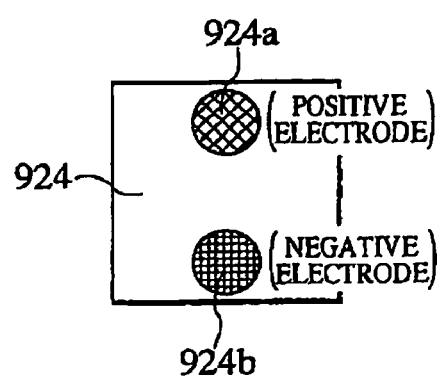
FIG. 10C is an enlarged view of portion B shown in FIG. 10A to show the shape of the light emitting diode provided in the light source module K9.

FIG. 7A shows directions of traveling of the light emitted by the light emitting diode 924 in the horizontal direction, in which the light emitting diode 924 has the square upper surface and is sealed by the conventional cylindrical lens 989. In addition, FIG. 7A is a cross sectional view, which is taken along line A-A of FIG. 10A. FIG. 7B shows directions of traveling of the light emitted by the light emitting diode 124 in the horizontal direction, in which the light emitting diode 124 has the rectangular upper surface and is sealed by resin forming a lens 29 according to the second embodiment. In addition, FIG. 7B is a cross sectional view, which is taken along line I-I of FIG. 3A. FIG. 7C shows directions of traveling of the light emitted by the light emitting diode 124 in the horizontal direction, in which the light emitting diode 124 has the rectangular upper surface and is sealed by resin forming a lens 39 according to the third embodiment. In addition, FIG. 7C is a cross sectional view, which is taken along line I-I of FIG. 3A.

As shown in FIG. 7A, the light emitting diode 924 is mounted on the light source mounting board 923 and sealed by the resin forming the cylindrical lens 989. In this case, as a single element, the light emitting diode 924 emits the light having lower intensities at the angles in the horizontal direction than those of the light emitted by the light emitting diode 124 (refer to FIG. 5A). The light emitting diode 924 uniformly emits light at the angles of −90 to +90 degrees in the horizontal direction with respect to the normal to the lower surface of the light emitting diode 924 with the center of the lower surface of the light emitting diode 924 as the origin of the radiation, where the normal extends through the center of the lower surface of the light emitting diode 924.

In FIG. 7B, on the other hands, as a single element, the light emitting diode 124 (mounted on the light source mounting board 123) according to the second embodiment emits light having higher intensities than those of light emitted by the light emitting diode 924 (refer to FIG. 5A). The lens 29 has two side surfaces (described in claim 7) 29s, two curved surfaces (described in claim 7) 29k, and an upper surface (described in claim 7) 29h. The side surfaces 29s are perpendicular to the upper surface of the light source mounting board 123. In addition, the curved surfaces 29k are continuous with the respective side surfaces 29s and an upper surface 29h. Each of the curved surfaces 29k has a curvature radius, which is increased as a portion of the curved surface 29k approaches the upper surface 29h. The upper surface 29h of the lens 29 is perpendicular to the normal to the upper surface of the light source mounting board 123.

Figure 5B:
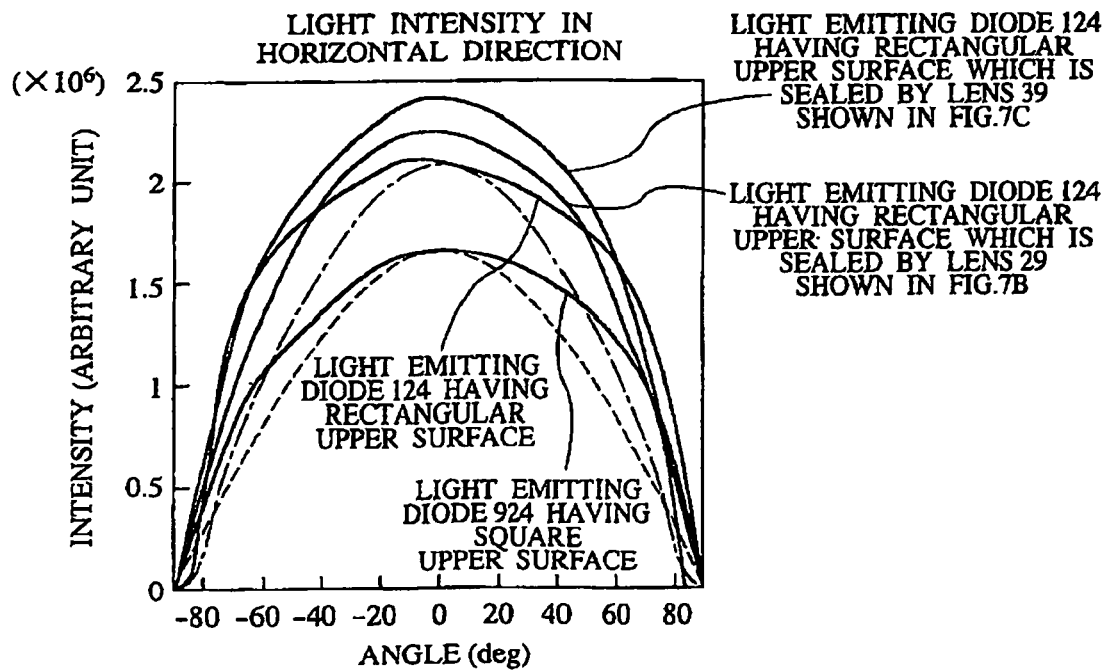
FIG. 5B is a graph showing perfect diffusion distribution (indicated by a dashed line) corresponding to intensities of light emitted by the light emitting diode having the square upper surface in the horizontal direction, perfect diffusion distribution (indicated by an alternate long and short dash line) corresponding to intensities of light emitted by the light emitting diode having the rectangular upper surface in the horizontal direction, and intensities of light emitted by the light emitting diode having the rectangular upper surface sealed by resin according to the embodiment in the horizontal direction.

FIG. 5B is a graph showing perfect diffusion distribution (indicated by a dashed line) corresponding to intensities of light emitted by the light emitting diode 124 having the rectangular upper surface in the horizontal direction (refer to FIG. 4A), and perfect diffusion distribution (indicated by an alternate long and short dash line) corresponding to intensities of light emitted by the light emitting diode 924 having the square upper surface in the horizontal direction (refer to FIG. 11A). In the graph shown in FIG. 5B, the angle of the direction of traveling of the light with respect to the normal to the lower surface of the light emitting diode is plotted on the abscissa axis, while the light intensity is plotted on the ordinate axis, where the normal extends through the center of lower surface of the light emitting diode and corresponding to the angle of zero degrees. The light intensity is expressed by an arbitrary unit such as Candela/m$^2$. The perfect diffusion distribution is a distribution of the light which uniformly diffuses even if the light travels a long distance.

As shown in FIG. 7B, a light source module K2 (which is an illumination device described in claim 7) has the lens 29 according to the second embodiment. The light source module K2 is capable of outputting light having higher light intensities at angles of approximately from −40 to +40 degrees in the horizontal direction with respect to the normal to the lower surface of the light emitting diode 124 than those of light emitted by the light emitting diode 124, which is not sealed by resin, where the normal extends through the center of the lower surface of the light emitting diode 124, as shown in FIG. 5B. The distribution of the intensities of the light emitted by the light emitting diode 124 shown in FIG. 7B is similar to the perfect diffusion distribution.

FIG. 8 is an enlarged view of an arrangement of the light guide plate 121 and the light source module K2 having the lens 29 according to the second embodiment. In FIG. 8, the light emitting diode 124 provided in the light source module K2 emits light (indicated by arrows) traveling to the light guide plate 121. The light source module K2 having the lens 29 according to the second embodiment allows a larger amount of the light output from the light source module K2 to be focused by the lens 29 on the side surface of the light guide plate 121 than that of the light output from the light source module K9 having the conventional cylindrical lens 989 shown in FIG. 12.

Third Embodiment

FIG. 7C shows a light source module K3 having a lens 39 according to a third embodiment of the present invention. The light emitting diode 124 shown in FIG. 7C, which has the rectangular upper surface and is mounted on the light source mounting board 123, is capable of emitting light having higher intensities than those of light emitted by the light emitting diode 924 having the square upper surface (refer to FIG. 5A). The light emitting diode 124 shown in FIG. 7C is sealed by the lens 39 according to the third embodiment. The lens 39 shown in FIG. 7C has two side surfaces 39s (described in claim 8), two curved surfaces 39k (described in claim 8), and two flat projecting surfaces 39t (described in claim 8). The side surfaces 39s are perpendicular to the upper surface of the light source mounting board 123. The curved surfaces 39k are continuous with the respective side surfaces 39s and the respective flat projecting surfaces 39t. Each of the curved surfaces 39k has a curvature radius, which is increased as a portion of the curved surface 39k approaches the flat projecting surface 39t. The flat projecting surfaces 39t form a protrusion projecting toward the light guide plate 121.

The light source module K3 (which is an illumination device described in claim 8) having the lens 39 according to the third embodiment is capable of outputting light having higher intensities in the horizontal direction than those of the light output from the light source module K2 having the lens 29 according to the second embodiment, as shown in FIG. 5B. The distribution of the intensities of the light output from the light source module K3 is similar to the perfect diffusion distribution.

Accordingly, the light source module K3 (which is an illumination device described in claim 8) having the lens 39 according to the third embodiment is capable of outputting light having high intensities in the horizontal direction more efficiently, compared with the light source module K according to the first embodiment and the light source module K2 according to the second embodiment.

Fourth Embodiment

Referring to FIGS. 3A to 3C, a description will be made of improvement of the efficiency of light outputted from the light source module K and traveling in the vertical direction (refer to FIG. 3A). As described above, FIG. 3B is a cross sectional view taken along line E-E of FIG. 3A. As shown in FIG. 3B, the lens 19 formed of the transparent resin has the upper surface 19u and is mounted on the light source mounting board 123 provided in the light source module K according to the first embodiment. The upper surface 19u is substantially parallel to the upper surface of the light source mounting board 123 and is flat, or curved. In this configuration, light c1 (shown in FIGS. 3B and 3C) is emitted by the light emitting diode 124 at a large angle with respect to the normal to the lower surface of the light emitting diode 124, the normal extending through the center of the lower surface of the light emitting diode 124. Since a refraction angle of the light c1 at the upper surface 19u is large, the light c1 is fully reflected by the upper surface 19u of the lens 19, and then travels within the lens 19 as light c2. This causes the loss of the light.

FIG. 3C is also a cross sectional view taken along line E-E of FIG. 3A. As shown in FIG. 3C, a light source module K4 has a lens 49 according to a fourth embodiment of the present invention. The lens 49 includes first portions (described in claim 3) 49a each having two first side surfaces and second portions (described in claim 3) 49b each having two second side surfaces. A distance between the first side surfaces of each of the first portions 49a is larger than a distance between the second side surfaces of each of the second portions 49b, where the distances are measured in a direction parallel to the horizontal direction. Each of the first portions 49a has a high upper surface 49u1, while each of the second portions 49b has a low upper surface 49u2. A distance between each of the high upper surfaces 49u1 and the upper surface of the light source mounting board 123 is larger than a distance between each of the low upper surfaces 49u2 and the upper surface of the light source mounting board 123. The lens 49 has inclined upper surfaces 49u3 (described in claim 3), which are continuous with and located between the respective high upper surfaces 49u1 and the respective low upper surfaces 49u2. Each of the inclined upper surfaces 49u3 is inclined with respect to the high and low upper surfaces 49u1 and 49u2. The lens 49 according to the fourth embodiment allows the light c1 shown in FIG. 3B to be output from the inclined upper surface 49u3 as light c3 shown in FIG. 3C, which prevents light from being lost due to reflection. It should be noted that the light c1 and c3 travel while being affected by respective refractive indexes.

Fifth Embodiment

Next, a description will be made of a light source module (illumination device) K5 according to the fifth embodiment with reference to FIGS. 9A to 9C. FIG. 9A is a top view of the light source module K5. FIG. 9B is a cross sectional view taken along line L-L of FIG. 9A. FIG. 9C is a cross sectional view taken along line J-J of FIG. 9A.

As shown in FIG. 9A, the red, green and blue light emitting diodes 124r, 124g and 124b are mounted on the light source mounting board 123 provided in the light source module K5. A group of the red, green and blue light emitting diodes 124r, 124g and 124b is repeatedly arranged in a direction substantially parallel to the long sides of the rectangular upper surface of each of the light emitting diodes. The red, green and blue light emitting diodes 124r, 124g and 124b are sealed by a cylindrical lens (lens body) 59 made of resin such as transparent acrylic. The shape of the cylindrical lens 59 is substantially parallel to the long sides of the rectangular upper surface of each of the red, green and blue light emitting diodes 124r, 124g and 124b, as shown in FIGS. 9B and 9C.

In the fifth embodiment, since the red, green and blue light emitting diodes 124r, 124g and 124b have the respective rectangular upper surfaces to emit light with high intensities, the light source module K5 is capable of outputting light with high luminance. In addition, since a group of the red, green and blue light emitting diodes 124r, 124g and 124b is repeatedly arranged in the fifth embodiment, color mixing can be performed to control white light. The light source module K5 is capable of improving uniformity of the luminance and colors within the light guide plate 121.

The configurations according to the first to fifth embodiments may be combined with any of the configurations.

According to the first to fifth embodiment, the light source module having the light emitting diodes as a light source is capable of outputting the light emitted by the light emitting diodes with an improved efficiency. Therefore, the present invention can achieve the illumination device capable of providing a highly uniform luminance distribution and the liquid crystal display device using the illumination device.

The present invention may be applicable to small and medium sized liquid crystal displays and the like, which are used for car navigation systems, mobile phones, and personal computers, in addition to liquid crystal display televisions.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An illumination device comprising:
   a circuit board;
   red, green and blue light emitting diodes, each of which is mounted on an upper surface of the circuit board and connected with a wiring pattern formed on the circuit board; and
   a lens body covering the red, green and blue light emitting diodes;
   wherein the lens body includes first portions each having two first side surfaces and second portions each having two second side surfaces, the first and second portions being alternately arranged, a distance between the first side surfaces being larger than a distance between the second side surfaces, and
   wherein the distance between the first side surfaces and the distance between the second side surfaces are measured in a direction parallel to a short side of the upper surface of the circuit board, and
   wherein the three red, green and blue light emitting diodes are mounted in each of the first portions of the lens body.

2. The illumination device according to claim 1, wherein part of light emitted by the red, green and blue light emitting diodes mounted in each of the first portions of the lens body propagates into any of the first portions, which is adjacent or close thereto, the part of the light being then outputted from the lens body and directed to an object to be irradiated.

3. The illumination device according to claim 1, wherein a distance between the upper surface of each first portion of the lens body and the upper surface of the circuit board is larger than a distance between the upper surface of each second portion of the lens body and the upper surface of the circuit board, and
   the lens body has inclined upper surfaces, which are continuous with and located between the respective first portions and the respective second portions, each of the inclined surfaces being inclined with the upper surfaces of the first and second portions.

4. The illumination device according to claim 1, wherein the light emitting diodes have respective rectangular upper surfaces and are arranged in a direction substantially parallel to a long side of the rectangular upper surfaces facing the same direction as the upper surface of the circuit board.

5. The illumination device according to claim 1, wherein the lens body has side surfaces and an upper surface, the side surfaces being perpendicular to the upper surface of the circuit board, the upper surface of the lens body being continuous with the side surfaces and having a curvature radius larger than a distance between the center of a lower surface of each of the light emitting diodes and a top portion of the lens body, the lower surface of each of the light emitting diodes facing the upper surface of the circuit board, the top portion of the lens body being the most distant portion of the lens body from the upper surface of the circuit board.

6. The illumination device according to claim 1, comprising
a reflective material having reflective surfaces, which are located on both sides of each of the light emitting diodes and inclined with respect to a normal to the upper surface of the circuit board to ensure that some components of light emitted by each of the light emitting diodes are reflected by the reflective surfaces and directed to an object to be irradiated,
wherein as a portion of each of the reflective surfaces is distant from each respective light emitting diode, the portion is distant from the upper surface of the circuit board.

7. The illumination device according to claim 1, wherein the lens body has side surfaces, curved surfaces and an upper surface, the side surfaces being perpendicular to the upper surface of the circuit board, the curved surfaces being continuous with and located between the respective side surfaces and the upper surface of the lens body and having respective curvature radii, each of which is increased as a portion of the curved surface approaches the upper surface of the lens body, the upper surface of the lens body being perpendicular to a normal to the upper surface of the circuit board.

8. The illumination device according to claim 1, wherein the lens body has side surfaces, curved surfaces and flat projecting surfaces, the side surfaces being perpendicular to the upper surface of the circuit board, the curved surfaces being continuous with and located between the respective side surfaces and the respective flat projecting surfaces and having respective curvature radii, each of which is increased as a portion of the curved surface approaches the flat projecting surface, the flat projecting surfaces forming a protrusion projecting toward an object to be irradiated.

9. The illumination device according to claim 1, wherein a backlight source having the light emitting diodes irradiates light from both sides of a display screen which displays an image.

10. An illumination device comprising:
a circuit board;
red, green and blue light emitting diodes, each of which is mounted on an upper surface of the circuit board and connected with a wiring pattern formed on the circuit board; and
a lens body covering the light emitting diodes;
wherein the red, green and blue light emitting diodes have respective rectangular upper surfaces facing the same direction as the upper surface of the circuit board, a group of the red, green and blue light emitting diodes being repeatedly arranged in a direction substantially parallel to long sides of the rectangular upper surface of each of the light emitting diodes, and
wherein a long side of the rectangular upper surface of the red, green and blue light emitting diodes is defined as a long side of the upper surface of the circuit board, and
wherein the lens body has a cylindrical shape extending substantially parallel to the long sides of the rectangular upper surface of each of the light emitting diodes.

11. A liquid crystal display device comprising the illumination device according to any one of claims 1 to 10.

* * * * *